United States Patent
Yang et al.

(10) Patent No.: US 6,879,034 B1
(45) Date of Patent: Apr. 12, 2005

(54) SEMICONDUCTOR PACKAGE INCLUDING LOW TEMPERATURE CO-FIRED CERAMIC SUBSTRATE

(75) Inventors: Jun Young Yang, Seoul (KR); Sun Goo Lee, Kyounggi-do (KR); Choon Heung Lee, Kyounggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 96 days.

(21) Appl. No.: 10/427,118

(22) Filed: May 1, 2003

(51) Int. Cl.[7] .................................... H01L 23/053
(52) U.S. Cl. ................ 257/700; 257/678; 257/690; 438/125
(58) Field of Search ................ 257/690, 700, 257/687, 680, 678; 438/125, 126, 127

(56) References Cited

U.S. PATENT DOCUMENTS

| | | | |
|---|---|---|---|
| 8,305 | A | 7/1851 | Mclellan et al. |
| 11,654 | A | 1/1854 | Kimura |
| 14,538 | A | 8/1856 | Kwan et al. |
| 24,122 | A | 2/1859 | Jung et al. |
| 27,297 | A | 3/1860 | Ikenaga et al. |
| 73,265 | A | 4/1868 | Hu et al. |
| 140,061 | A | 10/1873 | Lee |
| 140,068 | A | 10/1873 | Lee et al. |
| 163,015 | A | 11/1875 | Lee et al. |
| 5,278,446 | A | 1/1994 | Nagaraj et al. |
| 5,279,029 | A | 1/1994 | Burns |
| 5,294,897 | A | 3/1994 | Notani et al. |
| 5,327,008 | A | 7/1994 | Djennas et al. |
| 5,332,864 | A | 7/1994 | Liang et al. |
| 5,335,771 | A | 8/1994 | Murphy |
| 5,336,931 | A | 8/1994 | Juskey et al. |
| 5,343,076 | A | 8/1994 | Katayama et al. |
| 5,365,106 | A | 11/1994 | Watanabe |
| 5,381,042 | A | 1/1995 | Lerner et al. |
| 5,391,439 | A | 2/1995 | Tomita et al. |
| 5,406,124 | A | 4/1995 | Morita et al. |
| 5,410,180 | A | 4/1995 | Fujii et al. |
| 5,414,299 | A | 5/1995 | Wang et al. |
| 5,424,576 | A | 6/1995 | Djennas et al. |
| 5,428,248 | A | 6/1995 | Cha |

(Continued)

FOREIGN PATENT DOCUMENTS

| | | |
|---|---|---|
| DE | 1973494 A1 | 8/1997 |
| EP | 54021117 | 6/1979 |

(Continued)

*Primary Examiner*—Brad Smith
(74) *Attorney, Agent, or Firm*—Stetina Brunda Garred & Brucker

(57) ABSTRACT

A semiconductor package comprising a low temperature co-fired ceramic substrate defining opposed top and bottom surfaces. The substrate comprises at least two stacked ceramic layers and electrically conductive patterns which extend between the layers and along the top surface of the substrate. Mounted to the top surface of the substrate and electrically connected to the conductive patterns is at least one semiconductor die. A plurality of leads extend at least partially about the substrate in spaced relation thereto. Each of the leads defines opposed top and bottom surfaces, the semiconductor die being electrically connected to at least one of the leads. A package body at least partially encapsulates the substrate, the semiconductor die and the leads such that at least a portion of the bottom surface of each of the leads is exposed in the package body.

20 Claims, 14 Drawing Sheets

U.S. PATENT DOCUMENTS

| | | |
|---|---|---|
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,474 A | 9/2000 | Constantini et al. |
| 6,118,174 A | 9/2000 | Kim |
| 6,118,184 A | 9/2000 | Ishio et al. |
| RE36,907 E * | 10/2000 | Templeton, Jr. et al. .... 257/666 |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |

| | | | | | | |
|---|---|---|---|---|---|---|
| 6,303,997 | B1 | 10/2001 | Lee | JP | 5745959 | 3/1982 |
| 6,307,272 | B1 | 10/2001 | Takahashi et al. | JP | 58160095 | 8/1983 |
| 6,309,909 | B1 | 10/2001 | Ohgiyama | JP | 59208756 | 11/1984 |
| 6,316,838 | B1 | 11/2001 | Ozawa et al. | JP | 59227143 | 12/1984 |
| 6,323,550 | B1 | 11/2001 | Martin et al. | JP | 60010756 | 1/1985 |
| 6,326,243 | B1 | 12/2001 | Suzuya et al. | JP | 60116239 | 8/1985 |
| 6,326,244 | B1 | 12/2001 | Brooks et al. | JP | 60195957 | 10/1985 |
| 6,326,678 | B1 | 12/2001 | Karnezos et al. | JP | 60231349 | 11/1985 |
| 6,339,255 | B1 | 1/2002 | Shin | JP | 61395855 | 2/1986 |
| 6,348,726 | B1 | 2/2002 | Bayan et al. | JP | 629639 | 1/1987 |
| 6,355,502 | B1 | 3/2002 | Kang et al. | JP | 63205935 | 8/1988 |
| 6,369,454 | B1 | 4/2002 | Chung | JP | 63233555 | 9/1988 |
| 6,373,127 | B1 | 4/2002 | Baudouin et al. | JP | 63249345 | 10/1988 |
| 6,380,048 | B1 | 4/2002 | Boon et al. | JP | 63316470 | 12/1988 |
| 6,384,472 | B1 | 5/2002 | Huang | JP | 64054749 | 3/1989 |
| 6,387,507 | B1 * | 5/2002 | Jones et al. ............... 428/416 | JP | 1106456 | 4/1989 |
| 6,388,336 | B1 | 5/2002 | Venkateshwaran et al. | JP | 4098864 | 3/1992 |
| 6,395,578 | B1 | 5/2002 | Shin et al. | JP | 5129473 | 5/1993 |
| 6,400,004 | B1 | 6/2002 | Fan et al. | JP | 5166992 | 7/1993 |
| 6,414,385 | B1 | 7/2002 | Huang et al. | JP | 5283460 | 10/1993 |
| 6,437,429 | B1 | 8/2002 | Su et al. | JP | 692076 | 4/1994 |
| 6,444,499 | B1 | 9/2002 | Swiss et al. | JP | 6260532 | 9/1994 |
| 6,448,633 | B1 | 9/2002 | Yee et al. | JP | 7297344 | 11/1995 |
| 6,452,279 | B2 | 9/2002 | Shimoda | JP | 7312405 | 11/1995 |
| 6,464,121 | B2 | 10/2002 | Reijnders | JP | 864634 | 3/1996 |
| 6,476,474 | B1 | 11/2002 | Hung | JP | 8125066 | 5/1996 |
| 6,482,680 | B1 | 11/2002 | Khor et al. | JP | 8222682 | 8/1996 |
| 6,498,099 | B1 | 12/2002 | McLellan et al. | JP | 8306853 | 11/1996 |
| 6,498,392 | B2 | 12/2002 | Azuma | JP | 98205 | 1/1997 |
| 6,507,120 | B2 | 1/2003 | Lo et al. | JP | 98206 | 1/1997 |
| 6,559,525 | B2 | 5/2003 | Huang | JP | 98207 | 1/1997 |
| 6,661,084 | B1 * | 12/2003 | Peterson et al. ............ 257/680 | JP | 992776 | 4/1997 |
| | | | | JP | 9293822 | 11/1997 |

FOREIGN PATENT DOCUMENTS

| | | |
|---|---|---|
| JP | 10022447 | 1/1998 |
| EP | 59050939 | 3/1984 |
| JP | 10199934 | 7/1998 |
| EP | 0393997 | 10/1990 |
| JP | 10256240 | 9/1998 |
| EP | 0459493 | 12/1991 |
| JP | 00150765 | 5/2000 |
| EP | 0720225 | 3/1996 |
| KR | 941979 | 1/1994 |
| EP | 0720234 | 3/1996 |
| KR | 199772358 | 11/1997 |
| EP | 0794572 A2 | 10/1997 |
| KR | 100220154 | 6/1999 |
| EP | 0844665 | 5/1998 |
| KR | 0049944 | 6/2002 |
| EP | 0936671 | 8/1999 |
| WO | 9956316 | 11/1999 |
| EP | 0989608 | 3/2000 |
| WO | 9967821 | 12/1999 |
| EP | 1032037 | 8/2000 |
| JP | 55163868 | 12/1980 |

* cited by examiner

SEMICONDUCTOR PACKAGE INCLUDING LOW TEMPERATURE CO-FIRED CERAMIC SUBSTRATE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages and, more particularly, to a semiconductor package which is fabricated to include a low temperature co-fired ceramic (LTCC) substrate, and is uniquely configured to have a minimal profile while including one or more semiconductor dies and/or passive elements of various size and thickness.

2. Description of the Related Art

In the electronic arts and, more particularly, in the field of image mobile communications, there is an increasing need for various electronic components which are extremely small and light. In addition to the need for discrete component parts which are of decreased size and weight, there is also a need for an increase in wiring density in order to meet certain functional requirements. In order to meet these particular requirements, there have been developed in the prior art semiconductor packages fabricated through the implementation of a low temperature co-fired ceramic (LTCC) technique.

In the LTCC technique, a substrate is formed at a low temperature in the range of from about eight hundred degrees to one thousand degrees Celsius via the co-firing of ceramic and metal. Through the LTCC technique, a green sheet having a prescribed dielectric constant is formed by mixing glass having a low melting point with a ceramic. Thereafter, a conductive paste in which gold or copper is the primary material is printed and stacked on the green sheet. The LTCC technique for forming a substrate has proven superior to the prior art multi-layer PCB (printed circuit board) technique and the prior art MCM (multi chip module) technique in terms of wiring density and electrical and thermal characteristics. Passive elements, such as a capacitor, resistor, inductor or the like may be imbedded into the LTCC substrate, thereby accomplishing die integration and elevated reliability in a thin, light, and small structure.

However, LTCC substrates as currently known in the prior art possess certain deficiencies which detract from their overall utility. More particularly, in the LTCC technique as currently known, multiple substrate units are typically included in a conventional panel or strip. The strip is eventually cut or singulated in a manner separating the LTCC substrate units from each other, with each separated or singulated substrate unit constituting a portion of a corresponding semiconductor package. However, in the current LTCC technique, there is a susceptibility of warpage in the panel or strip, which creates problems in the manufacturing process for the semiconductor packages including the LTCC substrate units. To combat this problem, panels or strips of reduced size which are less susceptible to warpage are typically used, though such size reduction gives rise to productivity penalties since only a smaller number of semiconductor packages can be fabricated using the reduced size panel or strip.

In addition, in semiconductor packages including LTCC substrates, it is often desirable to mount various types of semiconductor elements (e.g., semiconductor dies and/or passive devices or elements) to the LTCC substrate. The configuration of LTCC substrates as currently known makes the mounting of such semiconductor elements thereto very difficult to control. The present invention addresses and overcomes these and other deficiencies of the current LTCC technique and LTCC substrate formed through the use of the same.

SUMMARY OF THE INVENTION

In accordance with the present invention, there are provided multiple embodiments of a semiconductor package which each include a low temperature co-fired ceramic substrate. The substrate comprises multiple stacked ceramic layers, and electrically conductive patterns which extend between the layers and along the top surface of the substrate. Disposed on the bottom surface of the substrate are electrode pads which are electrically connected to the conductive patterns through the use of vias. Mounted to the top surface of the substrate are one or more semiconductor dies which are electrically connected to the conductive patterns and to one or more leads extending about the substrate in certain embodiments of the present invention. Passive elements or devices may also be mounted to the top surface of the substrate and electrically connected to the conductive patterns or, alternatively, mounted to the top surfaces of one or more of the leads. These variations allow for the fabrication of the semiconductor package with a minimal profile despite size variations between the semiconductor die(s) and passive element(s). The manufacturing methodology employed in re ation to the various embodiments of the semiconductor package of the present invention also eliminates the formation of undesirable voids between the passive elements and the substrate, and undesirable warpage in the substrate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
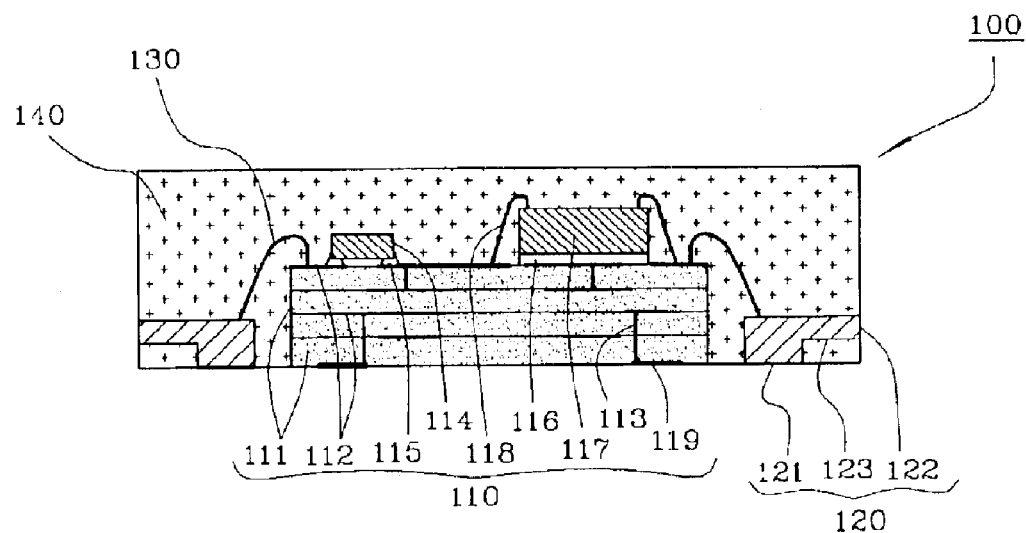
FIG. 1A is a cross-sectional view of a semiconductor package constructed in accordance with a first embodiment of the present invention.
Figure 1B:
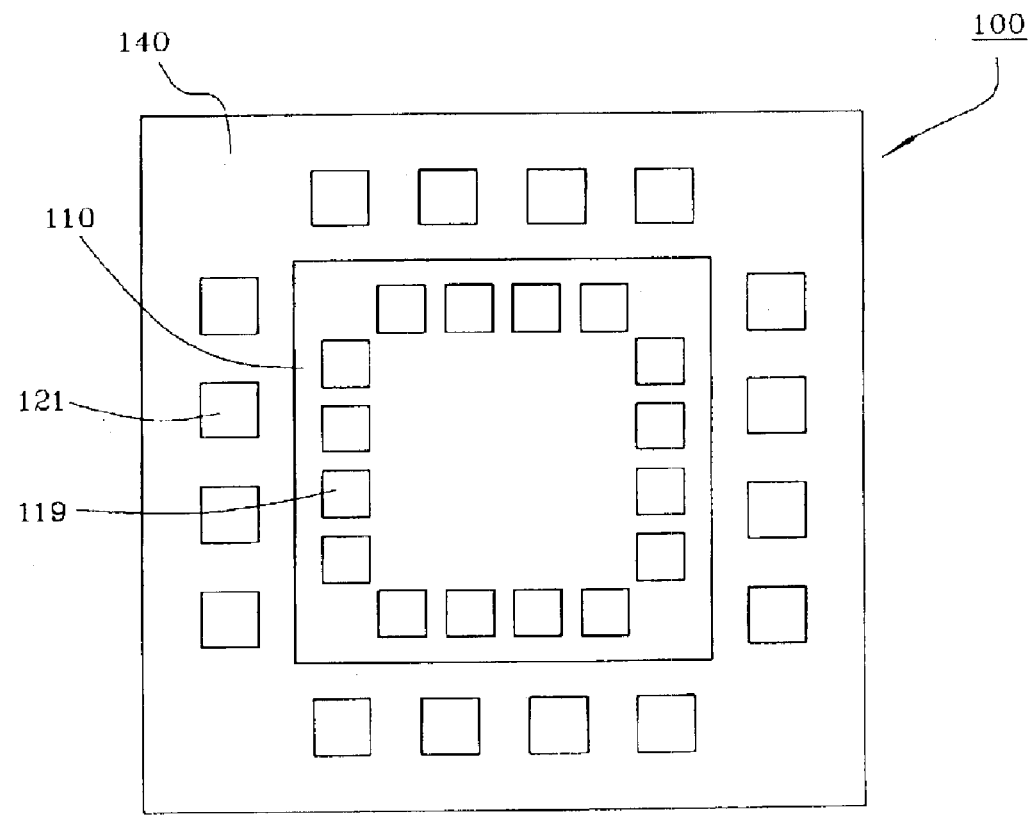
FIG. 1B is a bottom plan view of the semiconductor package of the first embodiment shown in FIG. 1A.

Referring now to the drawings wherein the showings are for purposes of illustrating various embodiments of the present invention only, and not for purposes of limiting the same, FIGS. 1A and 1B illustrate a semiconductor package 100 constructed in accordance with a first embodiment of the present invention. The semiconductor package 100 includes a low temperature co-fired ceramic (LTCC) substrate 110 which is a substantially planar plate. More particularly, the LTCC substrate 110 comprises a plurality of stacked ceramic layers 111. Formed on and in between the ceramic layers 111 are a plurality of electrically conductive patterns 112. The conductive patterns 112 formed on and in between the ceramic layers ill are electrically connected to each other through conductive vias 113. As best seen in FIG. 1A, the electrically conductive patterns 112 are included on the top surface of the uppermost ceramic layer 111 of the LTCC substrate 110. Included on the bottom surface of the lowermost ceramic layer 111 in the LTCC substrate 110 are a plurality of electrode pads 119 which are arranged in a generally square pattern as shown in FIG. 1B. The electrode pads 119 are electrically connected to the conductive patterns 112 through the use of the above-described conductive vias 113. The electrode pads 119 are electrically connectable to an external device through the use of solder.

In addition to the LTCC substrate 110, the semiconductor package 100 includes a plurality of conductive leads 120 which are arranged and extend at least partially about the periphery of the LTCC substrate 110 in spaced relation thereto. More particularly, as seen in FIG. 1B, the leads 120 are also arranged about the LTCC substrate 110 in a generally square pattern. Each of the leads 120 includes a top surface and an opposed bottom surface which defines an electrode pad 121 capable of being mounted or electrically connected to an external device. In addition to the top and bottom surfaces, each lead 120 defines a partially etched surface 123 which is disposed in opposed relation to the top surface, and is laterally offset or perpendicularly recessed relative to the electrode pad 121 defined by the bottom surface thereof. The top surface and the partially etched surface 123 of each lead 120 extend to a side surface 122 which extends perpendicularly therebetween. Those of ordinary skill in the art will recognize that the formation of the partially etched surface 123 within each lead 120 is optional.

When the partially etched surface 123 is omitted from the lead 120, the entire bottom surface of the lead 120 defines the electrode pad 121 thereof. Each lead 120 is preferably fabricated from a conductive material such as copper, steel, or an equivalent. However, the present invention is not limited to any particular material for each of the leads 120. The leads 120 are arranged about the LTCC substrate 110 such that the outer ends 122 thereof are disposed furthest from the LTCC substrate 110.

The semiconductor package 100 further comprises at least one semiconductor die 117 which is attached to the top surface of the uppermost ceramic layer 111 of the LTCC substrate 110 through the use of a layer 116 of die attach material. As seen in FIG. 1A, conductive wires 118 are used to electrically connect the pads or terminals of the semiconductor die(s) 117 to the conductive patterns 112 formed on the top surface of the uppermost ceramic layer 111 of the LTCC substrate 110. In addition to the semiconductor die(s) 117, also mounted to the top surface of the LTCC substrate 110 is at least one passive element 114. More particularly, the passive element(s) 114 is mounted on and electrically connected to the conductive patterns 112 included on the top surface of the uppermost ceramic layer 111 through the use of reflowed bumps 115 of solder. Though only one passive element 114 is shown in FIG. 1A, it is contemplated that a plurality of passive elements 114 will be mounted to the top surface of the LTCC substrate 110, and electrically connected to the conductive patterns 112 included thereon. Similarly, though only one semiconductor die 117 is shown in FIG. 1A, it is contemplated that multiple semiconductor dies 17 will be attached to the top surface of the LTCC substrate 110, and wire bonded to the conductive patterns 112 disposed thereon through the use of the above-described conductive wires 118.

As is further seen in FIG. 1A, the conductive patterns 112 included on the top surface of the LTCC substrate 110 (i.e., the top surface of the uppermost ceramic layer 111) are electrically connected to the conducive leads 120 through respective ones of a plurality of conductive wires 130. The conductive wires 130 extend to the top surfaces of respective ones of the leads 120, and are each preferably fabricated from gold, aluminum, or a functional equivalent. However, those of ordinary skill in the art will recognize that the present invention is not limited to any particular material for the conductive wires 118, 130. As will be recognized, based on the above-described construction, the electrical signals of the passive element(s) 114 and/or semiconductor die(s) 117 may be transmitted to an external device through the use of the electrode pads 119 of the LTCC substrate 110 and/or the electrode pads 121 defined by the leads 120. Those of ordinary skill in the art will recognize that only one or more semiconductor dies 117 may be mounted and electrically connected to the LTCC substrate 110 in the above-described manner (i.e., no passive element(s) 114 being included) and, similarly, that only one or more passive elements 114 may be mounted and electrically connected to the LTCC substrate 110 in the above-described manner (no semiconductor die(s) 117 being included).

In the semiconductor package 100, the LTCC substrate 110, the leads 120, the conductive wires 118, 130, semiconductor die(s) 117 and passive element(s) 114 are at least partially encapsulated by an encapsulant material which, upon hardening, forms a package body 140 of the semiconductor package 100. As seen in FIGS. 1A and 1B, the package body 140 is formed in a manner wherein the bottom surface of the lowermost ceramic layer 111 of the LTCC substrate 110, and hence the electrode pads 119 disposed thereon, are exposed in and substantially flush with the generally planar bottom surface of the package body 140. Similarly, the electrode pads 121 defined by the leads 120 are exposed in and substantially flush with the bottom surface of the package body 140, and extend in generally co-planar relation to the electrode pads 119 of the LTCC substrate 110. The side surfaces 122 of the leads 120 are themselves exposed in and substantially flush with respective ones of the four generally planar side surfaces defined by the package body 140. The flow of the encapsulant material over the partially etched surfaces 123 of the leads 120 creates a firm mechanical interlock between the leads 120 and package body 140.

In the semiconductor package 100, due to the inclusion of the leads 120 arranged about the periphery of the LTCC substrate 110, substantially more input and output pads are provided for the semiconductor die(s) 117 and/or passive element(s) 114.

Figure 2A:
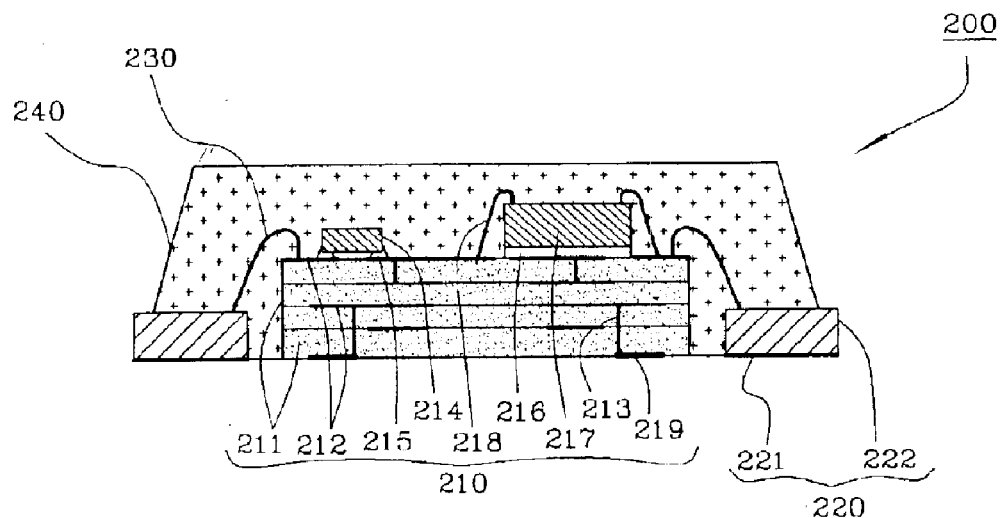
FIG. 2A is a cross-sectional view of a semiconductor package constructed in accordance with a second embodiment of the present invention.
Figure 2B:
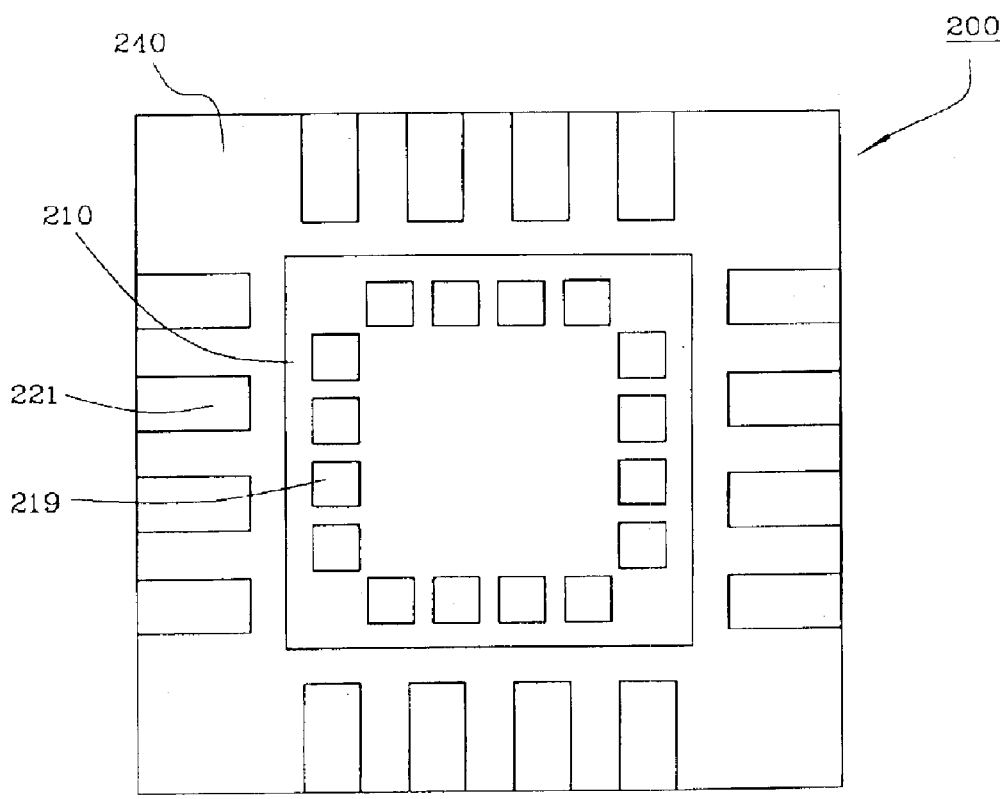
FIG. 2B is a bottom plan view of the semiconductor package of the second embodiment shown in FIG. 2A.

Referring now to FIGS. 2A and 2B, there is shown a semiconductor package 200 constructed in accordance with a second embodiment of the present invention. The semiconductor package 200 is substantially similar in structure and function to the above-described semiconductor package 100, with the various elements labeled with the 200 series reference numerals in FIGS. 2A and 2B corresponding to the same elements labeled with the 100 series reference numerals in FIGS. 1A and 1B. The distinctions between the semiconductor package 200 and the semiconductor package 100 lie primarily in the configuration of the leads 220 of the semiconductor package 200 in comparison to the leads 120 of the semiconductor package 100. In this regard, the leads 220 do not include the partially etched surface 123 described above in relation to each of the leads 120. Thus, the entirety of the generally planar bottom surface of each lead 220 defines the electrode pad 221 thereof.

A further distinction between the semiconductor package 200 and the semiconductor package 100 lies in the configuration of the package body 240 of the semiconductor package 200 in comparison to the package body 140 of the semiconductor package 100. More particularly, the package body 240 has a generally trapezoidal cross-sectional configuration. As a result, the package body 240 defines angled or sloped side surfaces which are slanted at a predetermined angle, and are not flush with the side surfaces 222 of the leads 220.

Figure 3A:
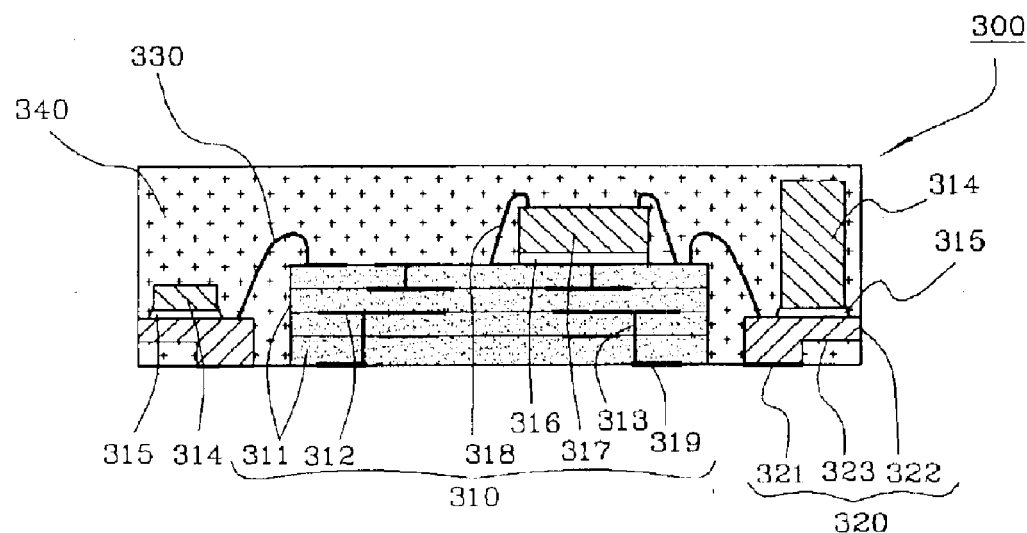
FIG. 3A is a cross-sectional view of a semiconductor package constructed in accordance with a third embodiment of the present invention.
Figure 3B:
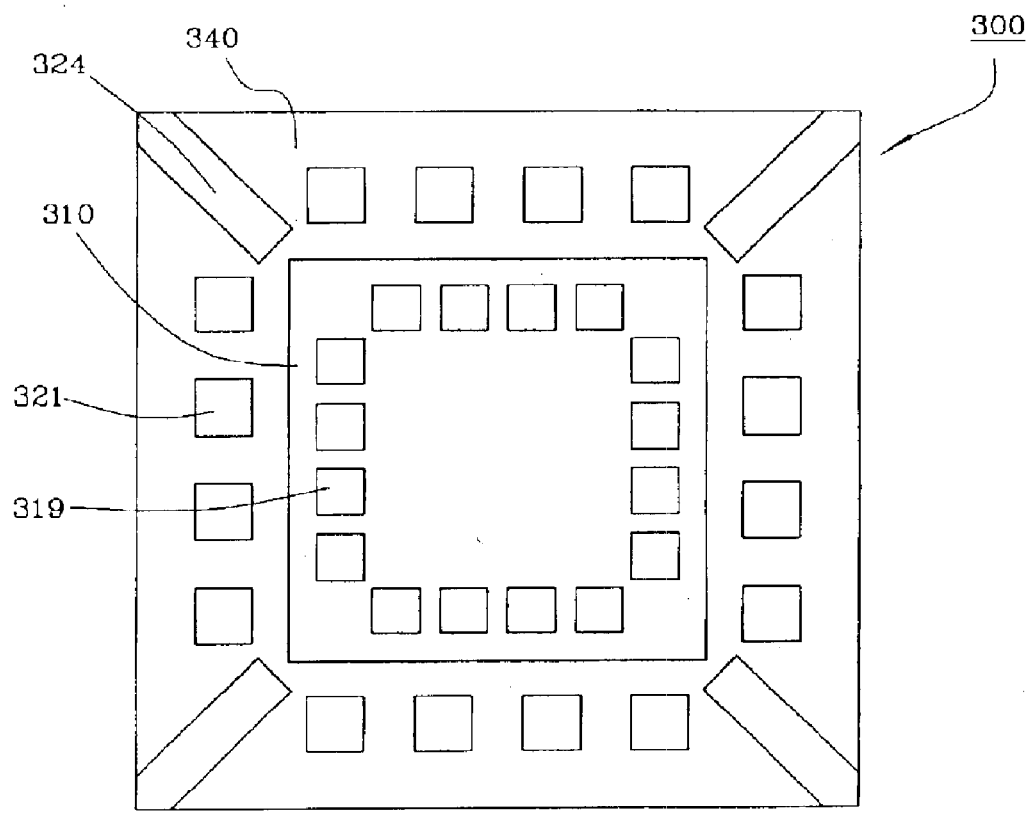
FIG. 3B is a bottom plan view of the semiconductor package of the third embodiment shown in FIG. 3A.

Referring now to FIGS. 3A and 3B, there is shown a semiconductor package 300 constructed in accordance with a third embodiment of the present invention. The semiconductor package 300 of the third embodiment is substantially similar in construction and function to the semiconductor package 100 of the first embodiment, with the elements labeled with the 300 series reference numerals in FIGS. 3A and 3B corresponding to respective ones of those elements labeled with the 100 series reference numerals in FIGS. 1A and 1B. One of the distinctions between the semiconductor package 300 and the semiconductor package 100 lies in the addition of tie bars 324 to the semiconductor package 300. Each of the tie bars 324 extends diagonally between an adjacent set of the leads 320 toward a respective one of the four corners defined by the LTCC substrate 310. In this regard, of the four sets of leads 320 extending along respective ones of the four peripheral edge segments defined by the LTCC substrate 310, each tie bar 324 extends between an adjacent set of leads 320 (i.e., two sets of the leads 320 separated by an approximately ninety degree angle). The tie bars 24 are each preferably fabricated from the same material as that of the leads 320. In the semiconductor package 300, the package body 340 thereof is formed such that the bottom surface of each tie bar 324 is exposed in and substantially flush with the generally planar bottom surface of the package body 340. Thus, like the leads 320, the tie bars 324 may be used in relation to electrical signal transmission.

A further distinction between the semiconductor package 300 and the semiconductor package 100 les in the mounting and electrical connection of the passive element(s) 314 directly to the top surface(s) of the lead(s) 320, as opposed to the passive element(s) 314 being electrically connected to the conductive patterns 312 disposed on the top surface of the LTCC substrate 310 (i.e., the top surface of the uppermost ceramic layer 311 of the LTCC substrate 310). As shown in FIG. 3A, multiple passive elements 314 are included in the semiconductor package 300, with each of the passive elements 314 being electrically connected to the top surface of a respective one of the leads 320 through the use of a layer 315 of solder.

In the semiconductor package 100, the mounting of the passive element(s) 114 to the conductive patterns 112 on the top surface of the LTCC substrate 110 is facilitated through the use of solder bumps 115. The use of the bumps 115, as opposed to a continuous layer, is necessitated by the arrangement of the conductive patterns 112. However, the use of the bumps 115 to facilitate the electrical connection of the passive element(s) 114 to the conductive patterns 112 creates susceptibility to a void phenomenon wherein a small gap is defined between the passive element(s) 114 and the top surface of the LTCC substrate 110, such gap being too small to allow for the flow of the encapsulant used to form the package body 140 thereinto. Such void is undesirable, and is eliminated in the semiconductor package 300 wherein a continuous layer 315 of solder may be used to electrically connect the passive element(s) 314 to the top surface of a respective lead 320. The mounting of the passive element(s) 314 directly to the lead(s) 320 also provides greater freedom in the manner in which the electrically conductive patterns 312 are formed on the top surface of the LTCC substrate 310. A further advantage of mounting and electrically connecting the passive element(s) 314 directly to the lead(s) 320 is that the inclusion of a passive element 314 in the semiconductor package 300 which is thicker than that of the semiconductor die 317 does not necessarily result in an increased thickness in the package body 340 due to the thickness of each lead 320 normally being less than that of the LTCC substrate 310.

Figure 4A:
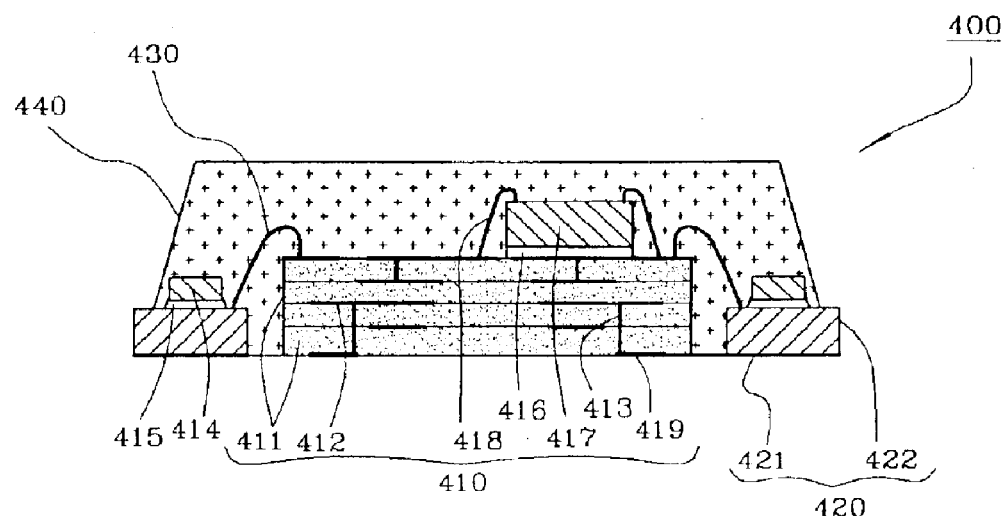
FIG. 4A is a cross-sectional view of a semiconductor package constructed in accordance with a fourth embodiment of the present invention.
Figure 4B:
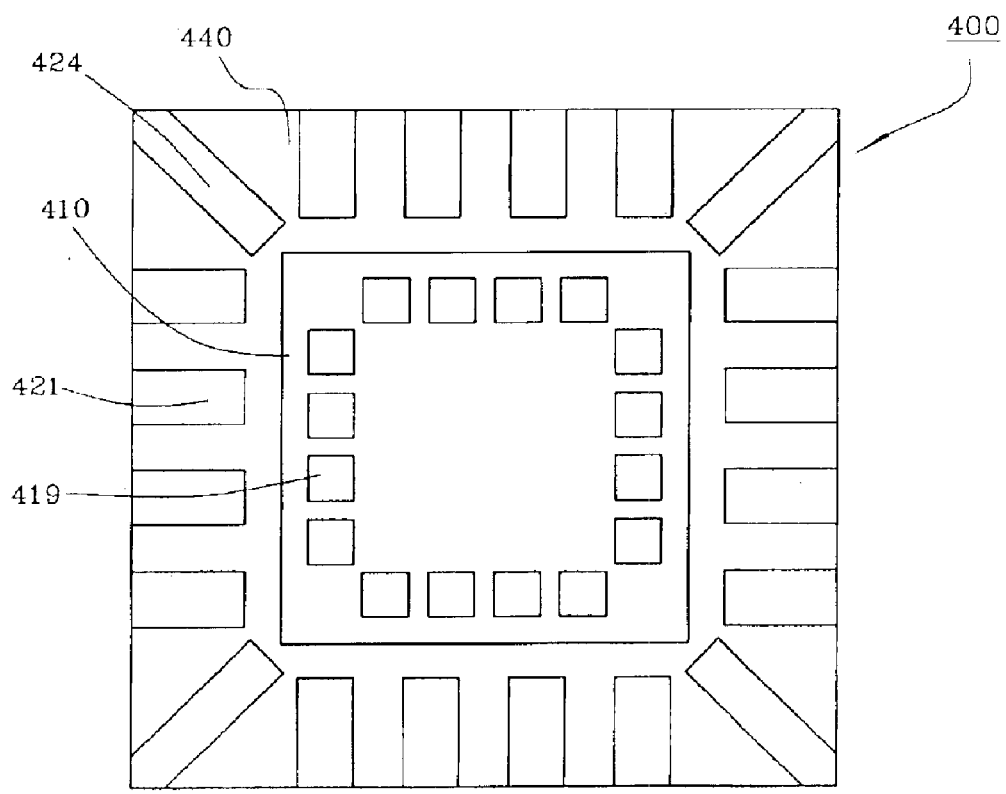
FIG. 4B is a bottom plan view of the semiconductor package of the fourth embodiment shown in FIG. 4A.

Referring now to FIGS. 4A and 4B, there is shown a semiconductor package 400 constructed in accordance with a fourth embodiment of the present invention. The semiconductor package 400 is substantially similar in structure and function to the above-described semiconductor package 300, with the elements labeled with the 400 series reference numerals in FIGS. 4A and 4B corresponding to respective ones of the elements labeled with the 300 series reference numerals in FIGS. 3A and 3B. The distinctions between the semiconductor package 400 and the semiconductor package 300 mirror the distinctions between the semiconductor package 200 and the semiconductor package 100. In this regard, in the semiconductor package 400, each of the leads 420 does not include the partially etched surface 323 included in each of the leads 320, thus resulting in the entirety of the generally planar bottom surface of each lead 420 defining the electrode pad 421 thereof. Further, the package body 440 of the semiconductor package 400 has a generally trapezoidal cross-sectional configuration, as results in the side surfaces 422 of the leads 420 not being flush with respective ones of the angled or sloped side surfaces defined by the package body 440.

Referring now to FIGS. 5A–5E, there is shown a step-by-step sequence for fabricating a semiconductor package 500 constructed in accordance with a fifth embodiment of the present invention. In the initial step of the fabrication method, a carrier frame 550 (shown in FIG. 5A) is provided. The carrier frame 550 is a substantially planar plate which defines a plurality of cavities 551 of predetermined size disposed in a common surface thereof in equidistantly spaced intervals. Each cavity 551 of the carrier frame 550 preferably has a square or rectangular configuration. The carrier frame 550 is preferably fabricated of conventional copper, aluminum, or an equivalent material, though the present invention is not limited to any particular material for the carrier frame 550. It will be noted that in FIG. 5A, only a portion of the carrier frame 550 is illustrated.

Figure 5A:
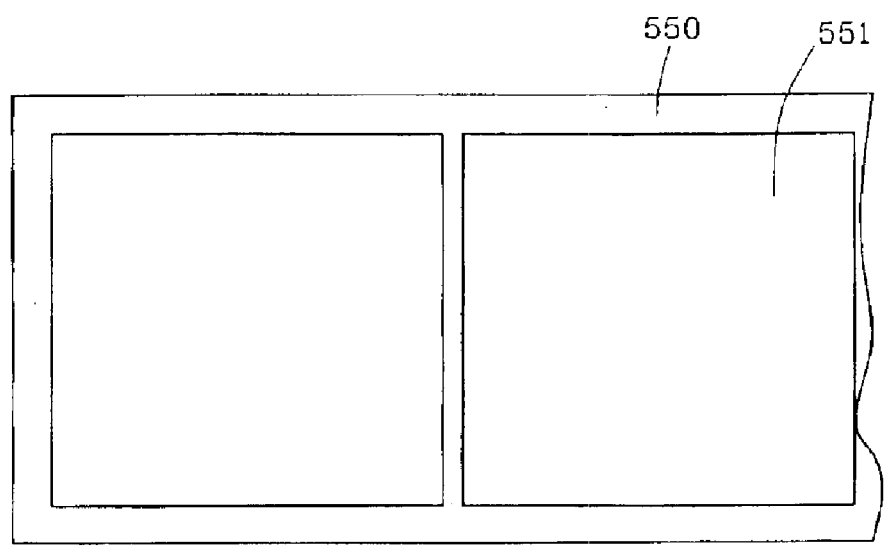
FIGS. 5A–5E are step-by-step illustrations of an exemplary method of manufacturing a semiconductor package constructed in accordance with a fifth embodiment of the present invention.
Figure 5B:
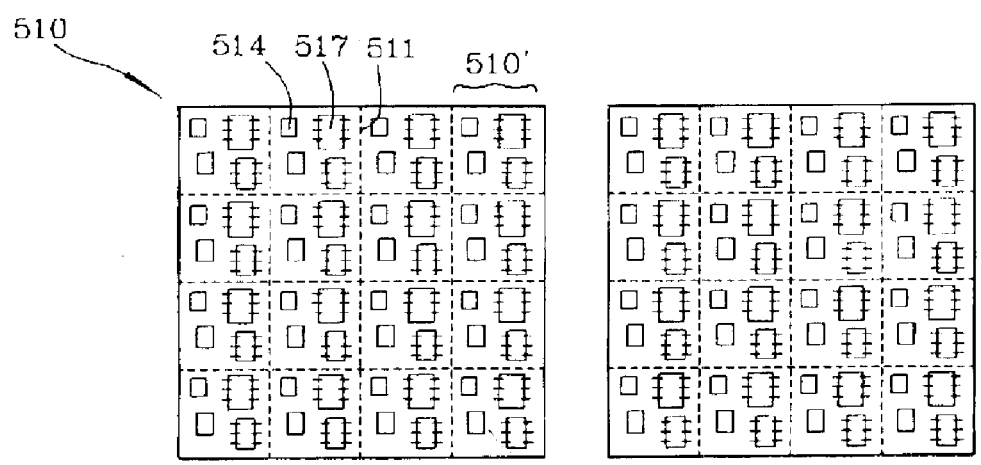

In the next step of the fabrication methodology, an LTCC substrate 510 (shown in FIG. 5B) is provided. The LTCC substrate 510 is a substantially planar plate, and includes a plurality of substrate units 510' which are arranged in a matrix (e.g., a four-by-four matrix as shown in FIG. 5B). Included in FIG. 5B are dotted lines which designate saw streets 511 along which cuts are made to separate the substrate units 510' from each other in a manner which will be described in more detail below. Formed on each of the substrate units 510' are the above-described electrode pads and conductive patterns. Additionally, mounted and electrically connected to the top surface of each of the substrate units 510' are one or more passive elements 514 and one or more semiconductor dies 517.

Figure 5C:
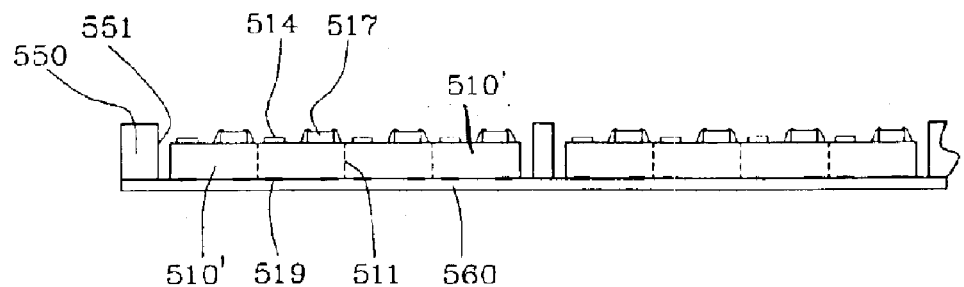

In the next step of the manufacturing method, a layer 560 of adhesive tape is bonded or applied to the bottom surface of the carrier frame 550 in order to effectively block one side or end of each cavity 551 (FIG. 5C). Thereafter, an LTCC substrate 510 is inserted into each cavity 551, the bottom surface of each LTCC substrate 510 being bonded to the adhesive tape 560. The bonding of the LTCC substrates 510 to the layer 560 of adhesive tape assists in the prevention of the warpage phenomenon described above.

Figure 5D:
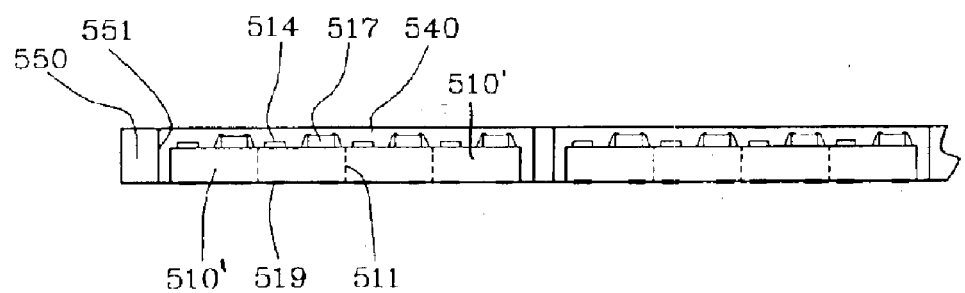

Subsequent to the adhesion of the LTCC substrates 510 to the layer 560 of adhesive tape, a molding process is completed wherein an encapsulant material is poured into each cavity 551 of the carrier frame 550 in a manner at least partially encapsulating the LTCC substrate 510 in the cavity 551 and the passive elements 514 and semiconductor dies 517 mounted thereto (FIG. 5D). The hardening of the encapsulant material within each cavity 551 forms an encapsulant body 540. The encapsulant body 540 partially encapsulating a respective LTCC substrate 510 may be formed by any one of a variety of conventional molding methods using a mold apparatus including upper and lower mold bodies. Subsequent to the formation of the encapsulant body 540 within each cavity 551, the layer 560 of adhesive tape is removed from the bottom surface of the carrier frame 550. Such removal results in the electrode pads 519 disposed on the bottom surface of the LTCC substrate 510 being exposed in and substantially flush with the generally planar bottom surface of the corresponding encapsulant body 540.

Subsequent to the removal of the layer 560 of adhesive tape, a sawing process is completed (FIG. 5E) wherein a saw blade is advanced along the saw streets 511 of each LTCC substrate 510. As will be recognized, the advancement of the saw blade(s) along the saw streets 511 effectively separates the substrate units 510' of each LTCC substrate 510 from each other, with each encapsulant body 540 also being cut in a manner separating the same into multiple package bodies partially encapsulating or covering respective ones of the substrate units 510'. The carrier frame 550 is completely eliminated or removed as a result of the sawing process.

Figure 5E:
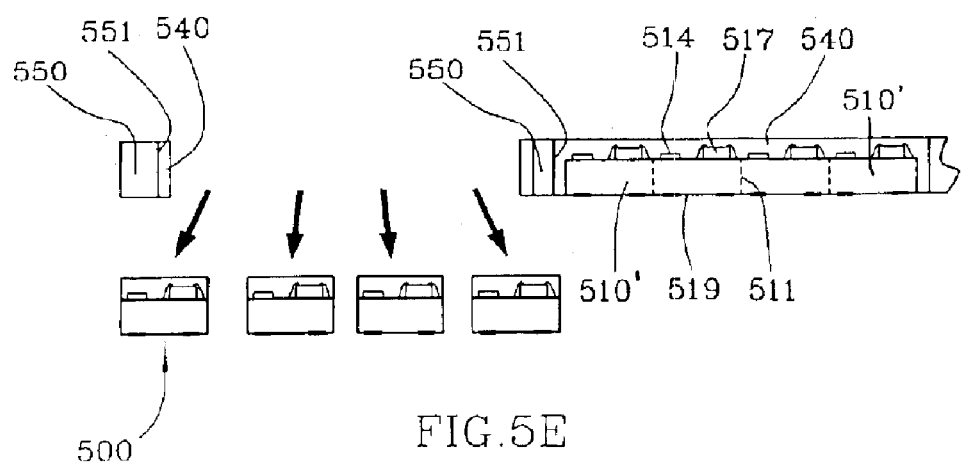

As seen in FIG. 5E, the semiconductor packages 500 resulting from the completion of the sawing process each comprise a substrate unit 510' having at least one passive unit 514 and at least one semiconductor die 517 electrically connected to the top surface thereof, the passive element(s) 514 and semiconductor die(s) 517 being encapsulated by the corresponding package body comprising a portion of the corresponding cut encapsulant body 540. Within each semiconductor package 500, the side surfaces of the package body are substantially flush or continuous with corresponding side surfaces of the substrate unit 510'. Those of ordinary skill in the art will recognize that a punching process may be employed as an alternative to the above-described sawing process to separate the individual semiconductor packages 500 from each other. Additionally, it is contemplated that semiconductor packages 500 may be separated from each other through a snap-cut wherein a plurality of recesses (not shown) are initially formed in each encapsulant body 540 along the saw streets of the corresponding LTCC substrate 510.

Each semiconductor package 500 formed in accordance with the above-described methodology includes the exposed electrode pads 519 which are disposed on the bottom surface of the substrate unit 510' thereof. As indicated above, mounted and electrically connected to the opposed top surface of such substrate unit 510' are one or more passive elements 514 and/or one or more semiconductor dies 517. As in the embodiments of the present invention discussed above, the passive element(s) 514 are preferably soldered to the conductive patterns of the substrate unit 510', with the semiconductor die(s) 517 being wire-bonded thereto. The package body of each semiconductor package 500 encapsulates or covers any passive element(s) 514 and any semiconductor die(s) 517 disposed on the top surface of the substrate unit 510', thus protecting the same from the external environment. As will be recognized, the electrode pads 519 disposed on the bottom surface of the substrate unit 510' are exposed, thus allowing the same to be mountable to an external device.

Figure 6A:
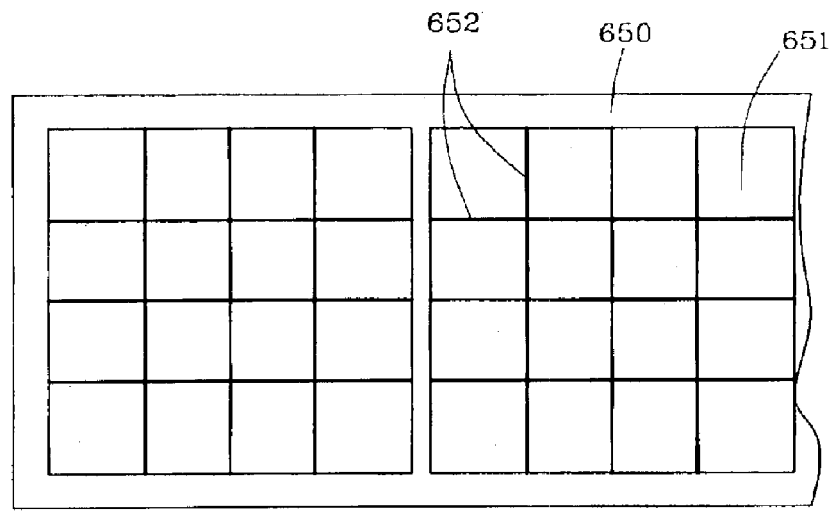
FIGS. 6A–6E are step-by-step illustrations of an exemplary method of manufacturing a semiconductor package constructed in accordance with a sixth embodiment of the present invention.
Figure 6B:
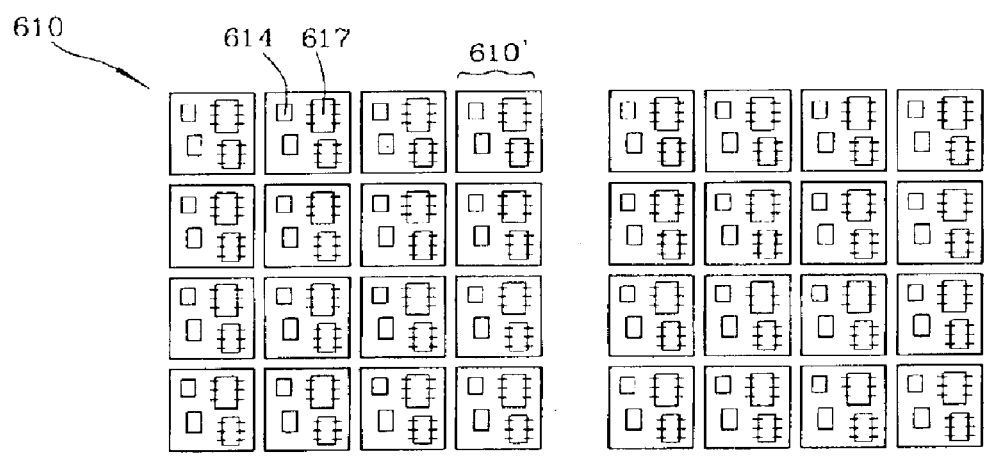

Referring now to FIGS. 6A–6E, there is illustrated a step-by-step sequence for manufacturing a semiconductor package 600 constructed in accordance with a sixth embodiment of the present invention. The steps corresponding to the manufacture of the semiconductor package 600 are substantially similar to those involved in the manufacture of the semiconductor package 500, with the various elements labeled with the 600 series reference numerals in FIGS. 6A–6E corresponding to the same elements labeled with the 500 series reference numerals in FIGS. 5A–5E. Distinctions in the fabrication methodologies lie primarily in the configuration of the carrier frame 650 as shown in FIG. 6A. More particularly, in addition to including the cavities 651, the carrier frame 650 used in the process of manufacturing the semiconductor packages 600 includes a plurality of bars 652 which extend in a criss-cross pattern within each cavity 651 of the carrier frame 650. The bars 652 are oriented relative to each other so as to define a plurality of openings arranged in a matrix (e.g., a four-by-four matrix) within each cavity 651. Each bar 652 may be fabricated from a material which is the same as or different from that of the carrier frame 650.

Figure 6C:
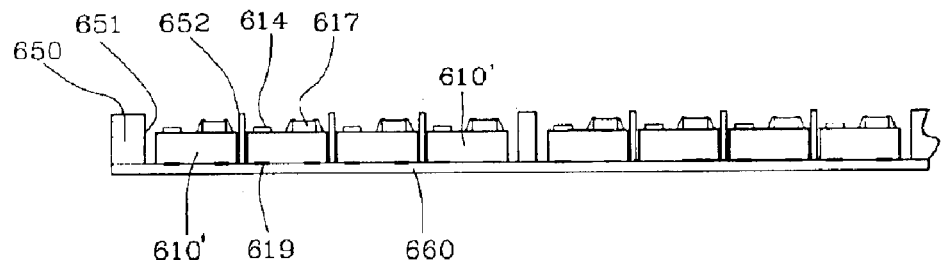
Figure 6D:
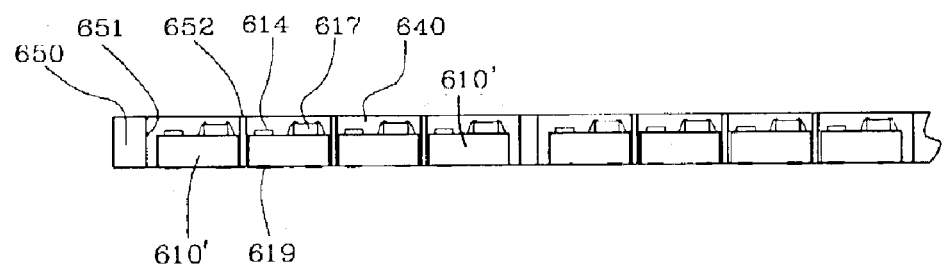
Figure 6E:
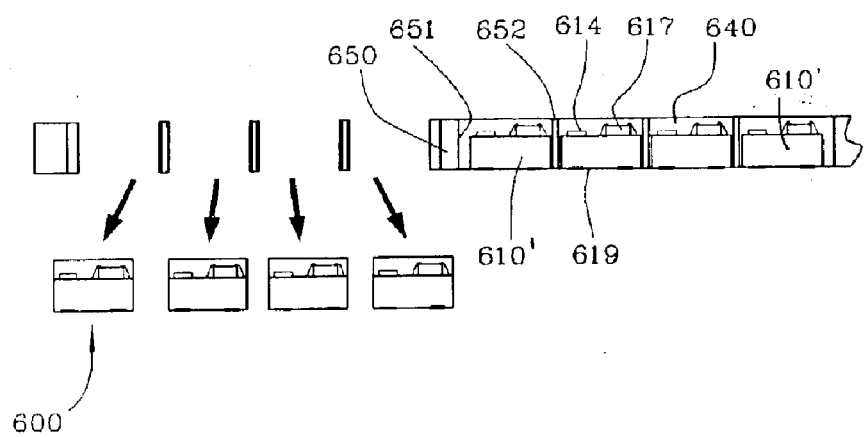

A further variation in the methodology for forming the semiconductor packages 600 lies in the singulation (e.g., sawing or punching) of each LTCC substrate 610 in a manner separating the substrate units 610' from each other prior to any cooperative engagement between the LTCC substrate 610 and the carrier frame 650. Subsequent to such singulation, the layer 660 of adhesive tape is bonded to the bottom surface of the carrier frame 650, thus effectively blocking or covering one end of each cavity 651 in the same manner described above in relation to the layer 560 of adhesive tape blocking each cavity 551. Thereafter, each separated substrate unit 610' (having one or more passive elements 614 and/or one or more semiconductor dies 617 electrically connected thereto) is advanced into a respective one of the openings defined by the bars 652 within each cavity 651 and adhered to the layer 660 of adhesive tape (FIG. 6C). As described above in relation to the manufacturing methodology for the semiconductor package 500, the bottom surface of each substrate unit 610' having the electrode pads 619 disposed thereon is adhered to the layer 660 of adhesive tape.

Thereafter, encapsulant bodies 640 are formed in respective ones of the cavities 651 of the carrier frame 650 in the same manner described above in relation to the formation of the encapsulant bodies 540. However, each encapsulant body 640 at least partially covers the bars 652 within the corresponding cavity 651, the top and bottom surfaces of each bar 652 remaining uncovered. Upon the removal of the layer 660 of adhesive tape, a singulation process (e.g., sawing or punching) is completed wherein the encapsulant body 640 within each cavity 651 of the carrier frame 650 is cut in a manner facilitating the creation of the individual semiconductor packages 600. Each semiconductor package 600 formed as a result of the completion of the singulation process has structural and functional attributes mirroring those of the above-described semiconductor packages 500.

Referring now to FIGS. 7A–7G, there is shown a step-by-step sequence for fabricating a semiconductor package 700 constructed in accordance with a seventh embodiment of the present invention. The semiconductor package 700 of the seventh embodiment has the same structural attributes of the semiconductor package 300 of the third embodiment, with the 700 series reference numerals used to label the semiconductor package 700 and various elements thereof corresponding to respective ones of the 300 series reference numerals used to label the semiconductor package 300 and various elements thereof. In the initial step of the fabrication method, a carrier frame 750 (shown in FIG. 7A) is provided. The carrier frame 750 is a substantially planar plate which defines a plurality of cavities 751 of predetermined size disposed in a common surface thereof at equidistantly spaced intervals. Each cavity 751 of the carrier frame 750 preferably has a square or rectangular configuration. The carrier frame 750 is preferably fabricated of conventional copper, aluminum, or an equivalent material, though the present invention is not limited to any particular material for the carrier frame 750. It will be noted that in FIG. 7A, only a portion of the carrier frame 750 is illustrated.

Figure 7A:
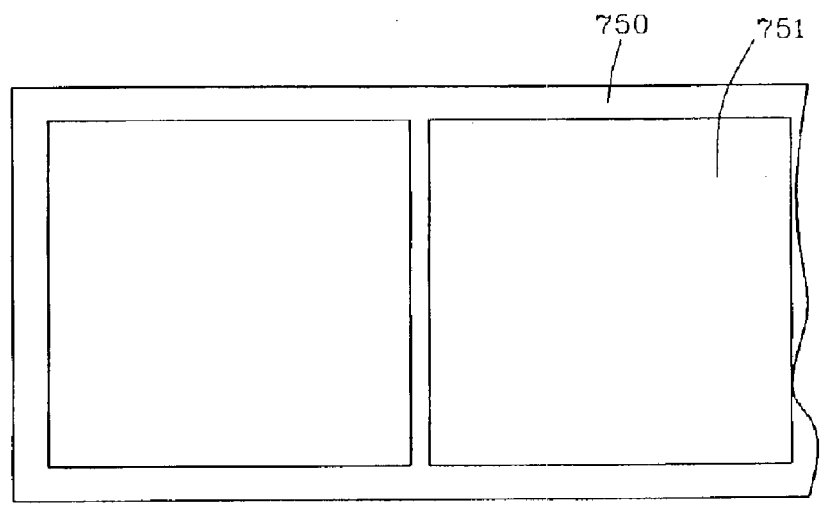
FIGS. 7A–7G are step-by-step illustrations of an exemplary method of manufacturing a semiconductor package constructed in accordance with a seventh embodiment of the present invention.
Figure 7B:
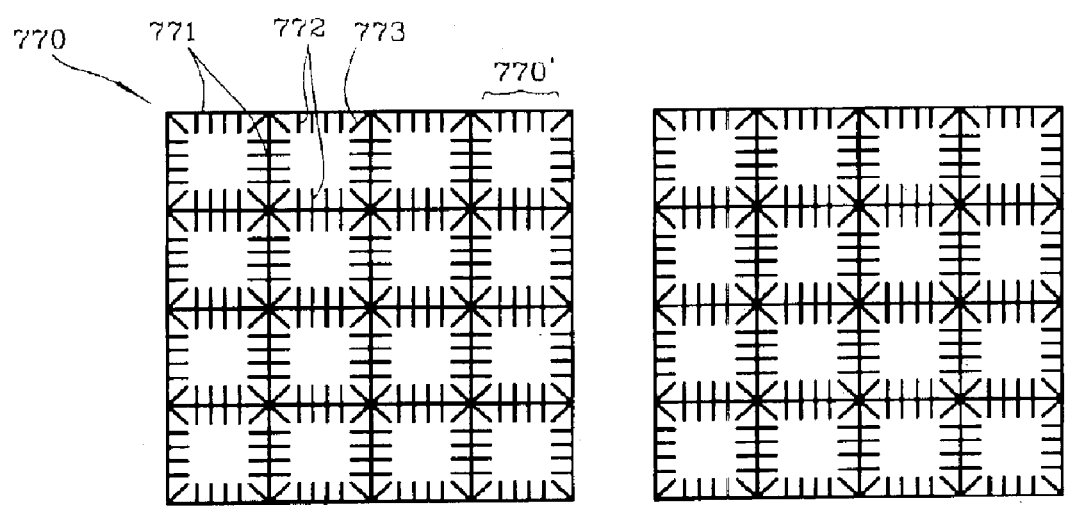
Figure 7C:
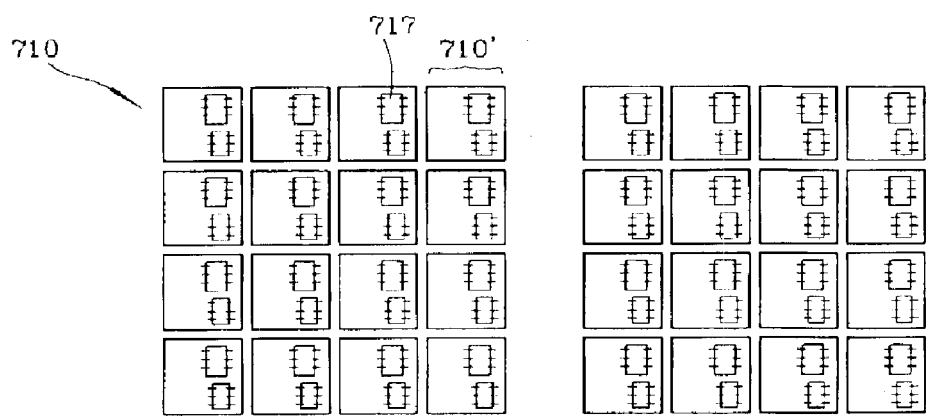

In the next step of the fabrication methodology, at least one leadframe 770 (shown in FIG. 7B) is provided. The leadframe 770 includes a plurality of leadframe units 770', which are arranged in a matrix (e.g., a four-by-four matrix as shown in FIG. 7B). Each leadframe unit 770' includes an outer frame which is defined by portions of supporting bars 771 of the leadframe 770 which are arranged in a criss-cross pattern. In addition to the outer frame, each leadframe unit 770' includes a plurality of leads 772 which extend inwardly from respective ones of the four sides defined by the corresponding outer frame. Extending diagonally inwardly from respective ones of the four corners defined by the outer frame are tie bars 773 of the leadframe unit 770'. However, those of ordinary skill in the art will recognize that the inclusion of the tie bars 773 in each leadframe unit 770' is optional. Also variable is the number, shape and orientation of the leads 772 of each leadframe unit 770'. The size of each leadframe 770 is preferably substantially equal to that of each cavity 751 of the carrier frame 750.

In the next step of the fabrication methodology, an LTCC substrate 710 (shown in FIG. 7C) is provided. The LTCC substrate 710 includes a plurality of substrate units 710' which are arranged in a matrix (e.g., a four-by-four matrix). Formed on each of the substrate units 710' are the above-described electrode pads and conductive patterns. Additionally, mounted and electrically connected to the top surface of each of the substrate units 710' are one or more semiconductor dies 717. In the manufacturing methodology for the semiconductor packages 700, each LTCC substrate 710 is singulated in a manner separating the substrate units 710' from each other prior to any cooperative engagement between the LTCC substrate 710 and the carrier frame 750, as described above in relation to the manufacturing methodology related to the semiconductor packages 600.

Figure 7D:
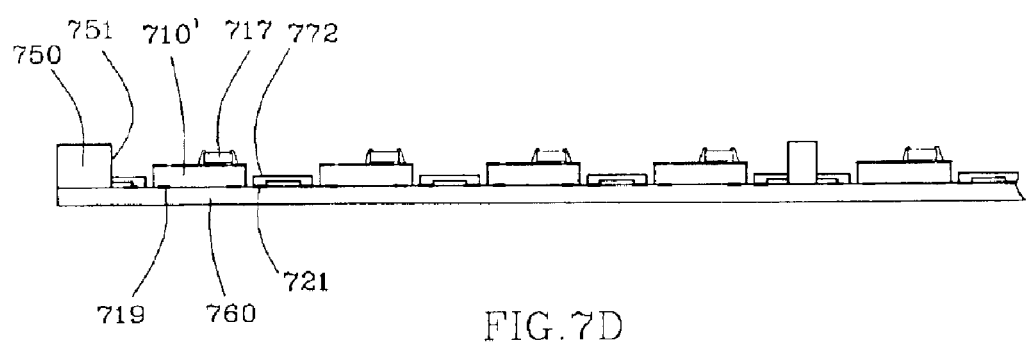

In the manufacturing method for the semiconductor packages 700, a layer 760 of adhesive tape is bonded to the bottom surface of the carrier frame 750, thus effectively blocking or covering one end of each cavity 751. Thereafter, each leadframe 770 is advanced into a respective cavity 751 of the carrier frame 750, and adhered to the layer 760 of adhesive tape (FIG. 7D). Thereafter, each singulated substrate unit 710' is oriented within a respective one of the outer frames of each leadframe unit 710' within each leadframe 710, and also adhered to the layer 760 of adhesive tape.

Figure 7E:
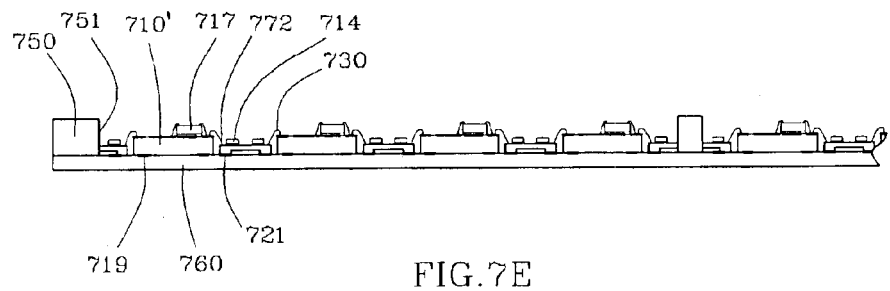

After the substrate units 710' have been adhered to the layer 760 of adhesive tape, the leads 772 of each leadframe unit 770' and the corresponding substrate unit 710' are electrically connected to each other in a prescribed manner through the use of conductive wires 730 (FIG. 7E). Either prior or subsequent to such wire bonding process, one or more passive elements 714 may be mounted to the top surfaces of one or more of the leads 772 of each leadframe unit 770'. It will be recognized that one or more passive elements 714 may optionally be mounted to the top surface of the corresponding substrate unit 710', alongside the one or more semiconductor dies 717 mounted thereto.

Figure 7F:
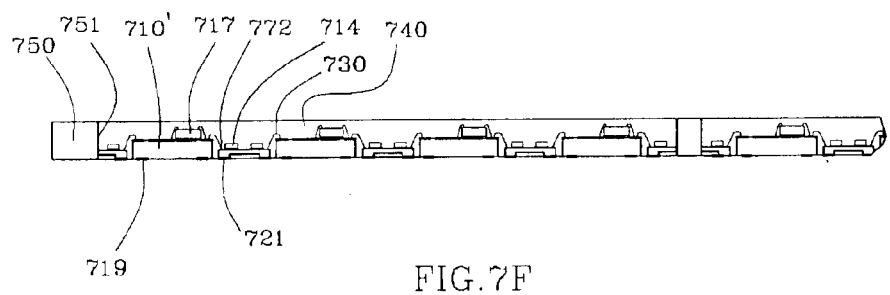
Figure 7G:
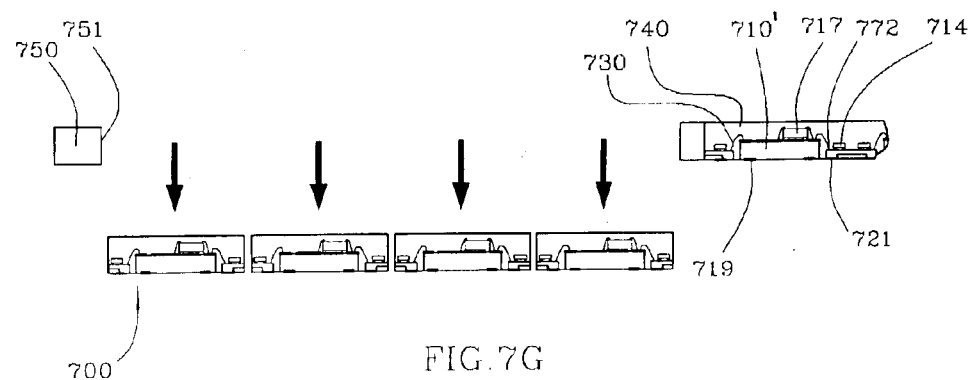
Figure 8A:
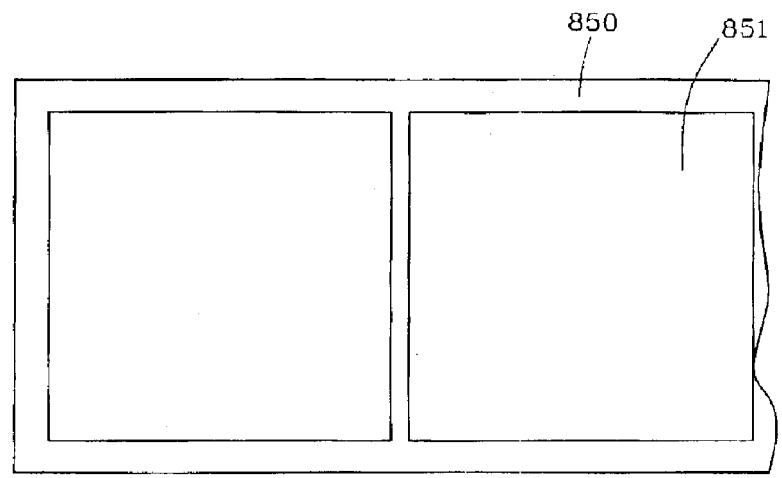
FIGS. 8A–8G are step-by-step illustrations of an exemplary method of manufacturing a semiconductor package constructed in accordance with an eighth embodiment of the present invention.
Figure 8B:
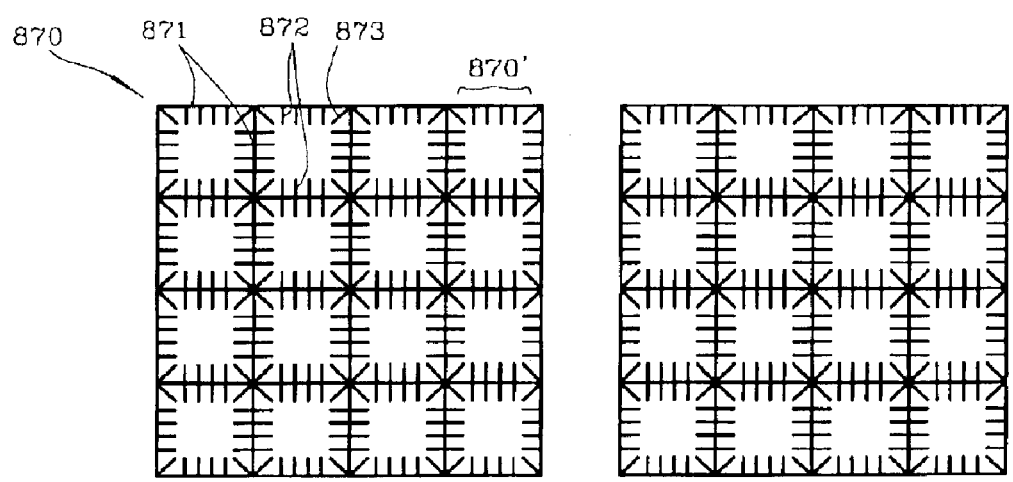
Figure 8C:
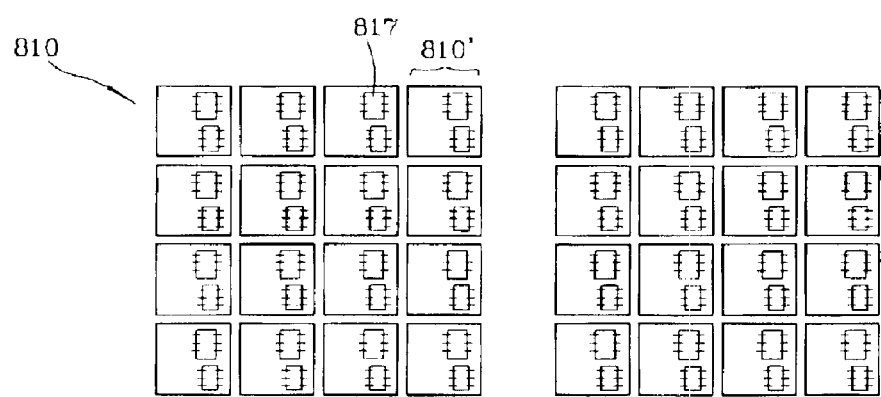
Figure 8D:
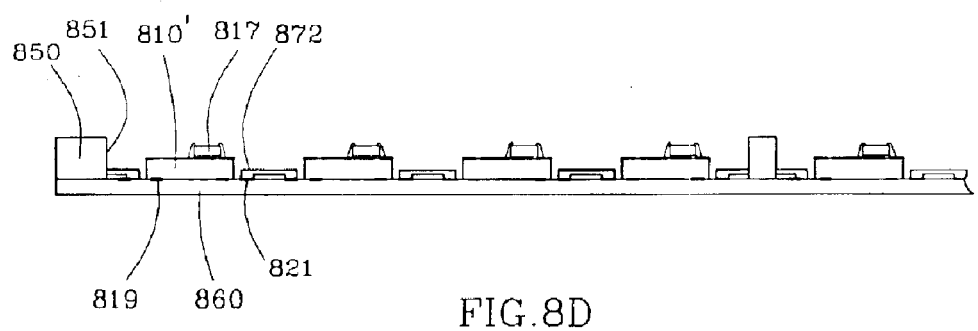
Figure 8E:
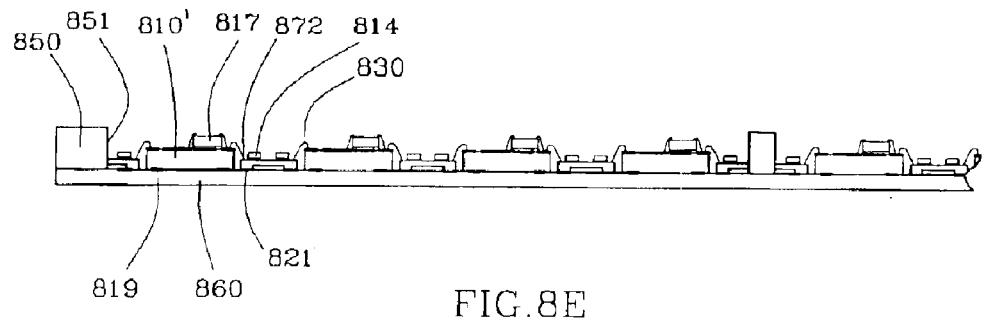
Figure 8F:
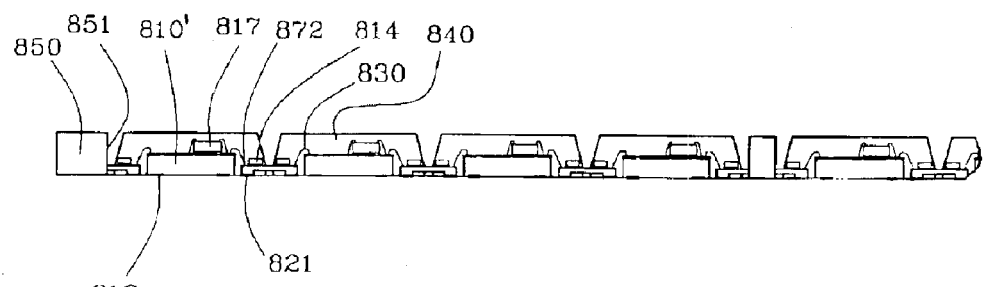
Figure 8G:
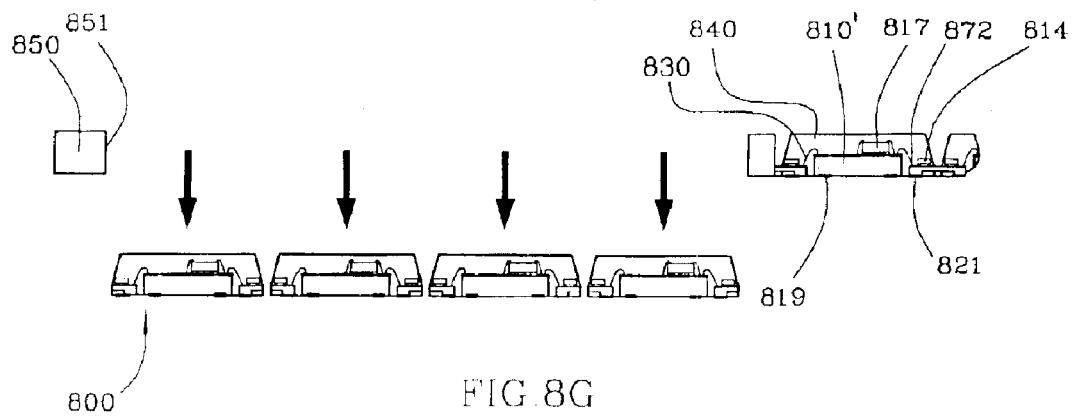

In the next step of the manufacturing method, a molding process is completed wherein an encapsulant material is poured into each cavity 751 of the carrier frame 750 in a manner at least partially encapsulating the leadframe 770 and substrate units 710' in each cavity 751, including the passive elements 714 and semiconductor dies 717 mounted thereto (FIG. 7F). The hardening of the encapsulant material within each cavity 751 forms an encapsulant body 740. The encapsulant body 740 may be formed by any one of a variety of conventional molding methods using a mold apparatus including upper and lower mold bodies. Subsequent to the formation of the encapsulant body 740 within each cavity 751, the layer 760 of adhesive tape is removed from the bottom surface of the carrier frame 750. Such removal results in the electrode pads 719 of each substrate unit 710' being exposed in and substantially flush with the generally planar bottom surface of the corresponding encapsulant body 740.

Subsequent to the removal of the layer 760 of adhesive tape, a sawing process is completed (FIG. 7G) wherein a saw blade is advanced along the supporting bars 771 of each leadframe 770 defining the outer frames of the leadframe units 770' thereof. The advancement of the saw blade(s) along the supporting bars 771 effectively separates the leadframe units 770' of each leadframe 770 from each other, with each encapsulant body 740 also being cut in a manner separating the same into multiple package bodies partially encapsulating or covering respective ones of the substrate units 710' and leadframe units 770'. A punch singulation process may be used as an alternative to the saw singulation process. As indicated above, each semiconductor package 700 formed as a result of the completion of the singulation process has structural and functional attributes mirroring those of the above-described semiconductor package 300 of the third embodiment.

Referring now to FIGS. 8A–G, there is illustrated a step-by-step sequence for manufacturing a semiconductor package 800 constructed in accordance with an eighth embodiment of the present invention. The steps corresponding to the manufacture of the semiconductor package 800 are substantially similar to those involved in the manufacture of the semiconductor package 700, with the various elements labeled with the 800 series reference numerals in FIGS. 8A–8G corresponding to the same elements labeled with the 700 series reference numerals in FIGS. 7A–7G. The semiconductor package 800 of the eighth embodiment is substantially similar in structure to the semiconductor package 700 of the seventh embodiment, except that the side surfaces of the package body 840 of each semiconductor package 800 are angled or sloped as shown in relation to the above-described semiconductor packages 200, 400.

The fabrication methodology for the semiconductor packages 800 differs from that employed in relation to the semiconductor packages 700 in that a pin gate encapsulating method 's used to form individual package bodies 840 on each leadframe unit 870' and respective ones of the substrate units 810' in lieu of the single, larger package body 740 described above in relation to the manufacturing methodology for the semiconductor packages 700. As indicated above, each package body 840 is formed to have sloped or angled side surfaces of predetermined shape. To complete the formation of the semiconductor packages 800, a punch singulation method is preferably used, with the punch being advanced through the supporting bars 87' defining the outer frames of each leadframe unit 870' of each leadframe 870. The completion of the pinching process effectively separates the leadframe units 870' of each leadframe 870 from each other, thus completing the formation of the semiconductor packages 800.

This disclosure provides exemplary embodiments of the present invention. The scope of the present invention is not limited by these exemplary embodiments. Numerous variations, whether explicitly provided for or implied by the specification, such as variations in structure, dimension and type of material and manufacturing process may be implemented by one of skill in the art in view of this disclosure.

What is claimed is:

1. A semiconductor package, comprising:
   a low temperature co-fired ceramic substrate defining opposed top and bottom surfaces, the substrate comprising at least two stacked ceramic layers and electrically conductive patterns which extend between the layers and along the top surface of the substrate;
   at least one semiconductor die mounted to the top surface of the substrate and electrically connected to the conductive patterns;
   a plurality of leads extending at least partially about the substrate in spaced relation thereto, each of the leads defining opposed top and bottom surfaces, the semiconductor die being electrically connected to at least one of the leads; and
   a package body at least partially encapsulating the substrate, the semiconductor die and the leads such that at least a portion of the bottom surface of each of the leads is exposed in the package body.

2. The semiconductor package of claim 1 wherein:
   at least one conductive wire is used to electrically connect the semiconductor die to the conductive patterns; and
   at least one conductive wire is used to electrically connect the conductive patterns to one of the leads.

3. The semiconductor package of claim 1 further comprising at least one passive element mounted to the top surface of the substrate and electrically connected to the conductive patterns.

4. The semiconductor package of claim 1 further comprising at least one passive element mounted and electrically connected to the top surface of one of the leads.

5. The semiconductor package of claim 4 wherein the passive element has an element thickness which exceeds a die thickness of the semiconductor die.

6. The semiconductor package of claim 1 wherein:
   the package body defines a generally planar bottom surface; and
   the portion of the bottom surface of each of the leads which is exposed in the package body defines an electrode pad which is substantially flush with the bottom surface of the package body.

7. The semiconductor package of claim 1 wherein:
   the package body defines multiple side surfaces; and
   each of the leads defines a side surface which is exposed in and substantially flush with a respective one of the side surfaces of the package body.

8. The semiconductor package of claim 1 wherein a portion of the top surface of each of the leads is exposed in the package body.

9. The semiconductor package of claim 1, wherein each of the leads comprises a partially etched surface which is disposed in opposed relation to the top surface and recessed relative to the bottom surface, the partially etched surface of each of the leads being covered by the package body.

10. The semiconductor package of claim 1 further comprising a plurality of tie bars which extend diagonally toward respective ones of four corner regions defined by the substrate, each of the tie bars defining opposed top and bottom surfaces, the bottom surface of each of the tie bars being exposed in the package body.

11. The semiconductor package of claim 1 wherein the bottom surface of the substrate is exposed in the package body.

12. The semiconductor package of claim 11 wherein the substrate comprises a plurality of electrode pads disposed on the bottom surface thereof and electrically connected to the conductive patterns.

13. The semiconductor package of claim 1 wherein the package body defines a plurality of side surfaces which each have a sloped configuration.

14. A semiconductor package, comprising:
   a low temperature co-fired ceramic substrate defining opposed top and bottom surfaces, the substrate comprising at least two stacked ceramic layers, electrically conductive patterns which extend between the layers and along the top surface of the substrate, and electrode pads disposed on the bottom surface of the substrate and electrically connected to the conductive patterns;

at least one semiconductor die mounted to the top surface of the substrate and electrically connected to the conductive patterns; and a package body at least partially encapsulating the substrate and the semiconductor die such that at least a portion of the bottom surface of the substrate and the electrode pads disposed thereon are exposed in the package body.

15. The semiconductor package of claim 14 wherein at least one conductive wire is used to electrically connect the semiconductor die to the conductive patterns.

16. The semiconductor package of claim 14 further comprising at least one passive element mounted to the top surface of the substrate and electrically connected to the conductive pattern.

17. The semiconductor package of claim 14 wherein:

the substrate includes multiple side surfaces; and the package body includes multiple side surfaces which extend in generally co-planar relation to respective ones of the side surfaces of the substrate.

18. A semiconductor package, comprising:

low temperature co-fired ceramic substrate defining opposed top and bottom surfaces, the substrate comprising a plurality of stacked ceramic layers and electrically conductive patterns which extend between the layers and along the top surface of the substrate;

a plurality of semiconductor dies mounted to the top surface of the substrate and electrically connected to the conductive patterns;

a plurality of leads extending at least partially about the substrate in spaced relation thereto, each of the leads defining opposed top and bottom surfaces, the semiconductor dies being electrically connected to at least some of the leads; and a package body at least partially encapsulating the substrate, the semiconductor dies and the leads such that at least a portion of the bottom surface of each of the leads is exposed in the package body.

19. The semiconductor package of claim 18 further comprising a plurality of passive elements mounted to the top surface of the substrate and electrically connected to the conductive patterns.

20. The semiconductor package of claim 18 wherein conductive wires are used to electrically connect the semiconductor dies to the conductive patterns, and to electrically connect the conductive patterns to the leads.

* * * * *